(12) United States Patent
Moon et al.

(10) Patent No.: US 12,021,523 B2
(45) Date of Patent: Jun. 25, 2024

(54) INTEGRATED CIRCUIT AND COMPUTING SYSTEM PERFORMING DYNAMIC VOLTAGE AND FREQUENCY SCALING AND METHOD OF OPERATING INTEGRATED CIRCUIT

(71) Applicant: SAMSUNG ELECTRONICS CO., LTD., Suwon-si (KR)

(72) Inventors: Gurnrack Moon, Seoul (KR); Younggwan Kim, Seoul (KR); Hojin Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/646,767

(22) Filed: Jan. 3, 2022

(65) Prior Publication Data

US 2022/0255549 A1     Aug. 11, 2022

(30) Foreign Application Priority Data

Feb. 5, 2021   (KR) .......................... 10-2021-0016840

(51) Int. Cl.
| | |
|---|---|
| *H03K 19/017* | (2006.01) |
| *G06F 1/08* | (2006.01) |
| *G06F 1/324* | (2019.01) |
| *G06F 1/3296* | (2019.01) |
| *G06F 11/30* | (2006.01) |
| *H03K 19/17728* | (2020.01) |
| *H03K 19/17736* | (2020.01) |
| *H03K 19/17784* | (2020.01) |

(52) U.S. Cl.
CPC ......... *H03K 19/01728* (2013.01); *G06F 1/08* (2013.01); *G06F 1/324* (2013.01); *H03K 19/17728* (2013.01); *H03K 19/1774* (2013.01); *H03K 19/17784* (2013.01)

(58) Field of Classification Search
CPC .......... G06F 1/08; G06F 1/324; G06F 1/3203; H03K 19/01728
See application file for complete search history.

(56) References Cited

U.S. PATENT DOCUMENTS

| | | | |
|---|---|---|---|
| 8,364,998 | B2 | 1/2013 | Hsu et al. |
| 8,996,331 | B2 | 3/2015 | Anderson et al. |

(Continued)

FOREIGN PATENT DOCUMENTS

CN        107256078        10/2017

*Primary Examiner* — Jaweed A Abbaszadeh
*Assistant Examiner* — Gayathri Sampath
(74) *Attorney, Agent, or Firm* — F. CHAU & ASSOCIATES, LLC

(57) ABSTRACT

The present disclosure provides an integrated circuit and a computing system. The integrated circuit and a computing system includes a dynamic voltage and frequency scaling (DVFS) operation and a method of operating the integrated circuit. The integrated circuit includes a plurality of sub blocks and a dynamic voltage and frequency scaling (DVFS) controller. The DVFS controller is configured to output a workload of the plurality of sub blocks, determine a first frequency corresponding to the workload, determine a first voltage corresponding to the first frequency, and provide a second frequency among at least one frequency corresponding to the first voltage to the plurality of sub blocks.

20 Claims, 12 Drawing Sheets

(56) References Cited

U.S. PATENT DOCUMENTS

| | | | |
|---|---|---|---|
| 9,671,847 B2 | 6/2017 | Kim et al. | |
| 10,296,067 B2 | 5/2019 | Park et al. | |
| 10,359,833 B2 | 7/2019 | Banerjee et al. | |
| 2005/0132238 A1* | 6/2005 | Nanja | G06F 1/3203 713/300 |
| 2008/0133947 A1* | 6/2008 | Shimada | G06F 1/3203 712/226 |
| 2011/0173432 A1* | 7/2011 | Cher | G01R 31/31725 702/186 |
| 2013/0166924 A1* | 6/2013 | Yang | G06F 1/324 713/300 |
| 2016/0327999 A1* | 11/2016 | Chang | G06F 1/206 |
| 2017/0269629 A1* | 9/2017 | Chou | G06F 1/3293 |
| 2018/0373287 A1* | 12/2018 | Al-Rawi | G06F 9/5044 |
| 2019/0041944 A1 | 2/2019 | Abu et al. | |
| 2019/0115924 A1* | 4/2019 | Betz | H03K 19/17784 |

\* cited by examiner

FIG. 7

| clock(MHz) | voltage(mV) | |
|---|---|---|
| | SYSTEM1 | SYSTEM2 |
| 400 | 700 | 687.5 |
| 410 | 700 | 687.5 |
| 420 | 700 | 693.75 |
| 430 | 700 | 693.75 |
| 440 | 706.25 | 700 |
| 450 | 706.25 | 700 |
| 460 | 713 | 700 |
| 470 | 713 | 700 |
| 480 | 720.5 | 700 |

FIG. 9

| CLOCK(MHz) | VOLTAGE(mV) | |
| --- | --- | --- |
| | T1 | T2 |
| 400 | 700 | 700 |
| 410 | 700 | 700 |
| 420 | 700 | 700 |
| 430 | 700 | 700 |
| 440 | 706.25 | 700 |
| 450 | 706.25 | 700 |
| 460 | 713 | 706.25 |
| 470 | 713 | 706.25 |
| 480 | 720.5 | 706.25 |

INTEGRATED CIRCUIT AND COMPUTING SYSTEM PERFORMING DYNAMIC VOLTAGE AND FREQUENCY SCALING AND METHOD OF OPERATING INTEGRATED CIRCUIT

CROSS-REFERENCE TO RELATED APPLICATIONS

This application is based on and claims priority under 35 U.S.C. § 119 to Korean Patent Application No. 10-2021-0016840, filed on Feb. 5, 2021, in the Korean Intellectual Property Office, the disclosure of which is incorporated by reference herein in its entirety.

BACKGROUND

The present disclosure relates to an integrated circuit, more particularly, to an integrated circuit and a computing system performing a dynamic voltage and frequency scaling (DVFS) operation, and a method of operating the integrated circuit.

An integrated circuit is a set of electronic circuits, established on semiconductor material, used to perform calculations. Electronic devices such as mobile devices, computers, laptops, and navigation systems are examples of devices that use integrated circuits. Computing devices such as mobile devices have become more compact.

The complexity of power management in mobile devices has increased as the number of processors and Internet Protocol (IP) devices included in a mobile device have increased to improve the performance of the mobile device. As such, the performance of the electronic device has increased, while demand for power management has also increased.

In some cases, power is set based on a fixed lookup table and does not consider other factors. Therefore, there is a need in the art for improved power management based on dynamic factors that change in real-time.

SUMMARY

According to the present disclosure, provided are an integrated circuit and a computing system, in which operating voltage versus performance is optimized, perform a dynamic voltage and frequency scaling (DVFS) operation considering environmental factors, and a method of operating the integrated circuit.

According to an aspect of the present disclosure, an integrated circuit includes a plurality of sub blocks, and a dynamic voltage and frequency scaling (DVFS) controller configured to output a workload of the plurality of sub blocks, to determine a first frequency corresponding to the workload, to determine a first voltage corresponding to the first frequency, and to provide, to the plurality of sub blocks, a second frequency among at least one frequency corresponding to the first voltage.

According to an aspect of the present disclosure, a method of operating an integrated circuit includes calculating a workload of a plurality of sub blocks, determine a first frequency corresponding to the workload, calculating a first voltage corresponding to the first frequency, and providing, to the plurality of sub blocks, a second frequency among at least one frequency corresponding to the first voltage.

According to an aspect of the present disclosure, a computing system includes a plurality of sub blocks, a memory storing clock signal information according to a workload of the plurality of sub blocks, and a dynamic voltage and frequency scaling (DVFS) table indicating power voltage information according to the workload of the plurality of sub blocks, an environmental management unit configured to generate environmental information of the computing system, and a DVFS controller configured to modify the DVFS table stored in the memory based on the environmental information, to calculate a workload of the computing system, and to perform a DVFS operation on the plurality of sub blocks based on the workload and the modified DVFS table.

According to an aspect of the present disclosure, an integrated circuit includes at least one sub block configured to process instructions, a power management unit (PMU) configured to receive a power voltage control signal indicating a magnitude of a power voltage and generate the power voltage based on power voltage control signal, a clock management unit (CMU) configured to receive a clock control signal indicating a frequency and generate a clock signal at the indicated frequency based on the clock control signal, and a dynamic voltage and frequency scaling (DVFS) controller configured to determine a workload of the at least one sub block, identify a first frequency based on the workload, determine a first voltage corresponding to the first frequency, transmit the power voltage control signal to the PMU to set the power voltage to the first voltage, identify a second frequency based on the first voltage, and transmit the clock control signal to the CMU to set the clock control signal to the second frequency.

BRIEF DESCRIPTION OF THE DRAWINGS

Embodiments of the present disclosure will be more clearly understood from the following detailed description taken in conjunction with the accompanying drawings in which:

FIG. 7 is a table showing a relationship between an operating frequency and an operating voltage with respect to different systems according to an example embodiment of the present disclosure;

FIG. 9 is a table showing a relationship between an operating frequency and an operating voltage with respect to different systems according to an example embodiment of the present disclosure;

DETAILED DESCRIPTION OF THE EMBODIMENTS

The present disclosure relates to an integrated circuit, more particularly to an integrated circuit and a computing system performing a dynamic voltage and frequency scaling (DVFS) operation and a method of operating the integrated circuit.

In some embodiments, the present disclosure may establish a target voltage based on workload, and the highest frequency (from a group of frequencies corresponding to the target voltage) may set as the target frequency. As a result, high performance is performed with the same power consumption. Additionally, DVFS can be performed with considering environmental information of the mobile device. For example, a voltage and clock frequency based on a workload can vary based on aging, temperature, or humidity. As a result, improved performance may be based on changing environmental information.

DVFS operations are performed in mobile devices, along with personal computers and the like. As such, a clock management unit (CMU) may change the clock frequency and the power management unit (PMU) changes the voltage. Target voltage may set to a voltage value, where there are multiple frequencies corresponding to the target voltage. As a result, the target voltage and target frequency are established based on a fixed DVFS value and do not take multiple frequencies into consideration. In some cases, an application processor of a mobile device may perform power management by controlling a voltage through a DVFS operation of controlling a frequency and voltage in the application processor.

The integrated circuit and computing system of the present disclosure includes a dynamic voltage and frequency scaling (DVFS) operation and a method of operating the integrated circuit. The integrated circuit may include a plurality of sub blocks and a dynamic voltage and frequency scaling (DVFS) controller. The DVFS controller may configured to output a workload of the plurality of sub blocks, determine a first frequency corresponding to the workload, determine a first voltage corresponding to the first frequency, and provide a second frequency among at least one frequency corresponding to the first voltage to the plurality of sub blocks.

Hereinafter, embodiments of the present disclosure will be described in detail with reference to the accompanying drawings.

Figure 1:
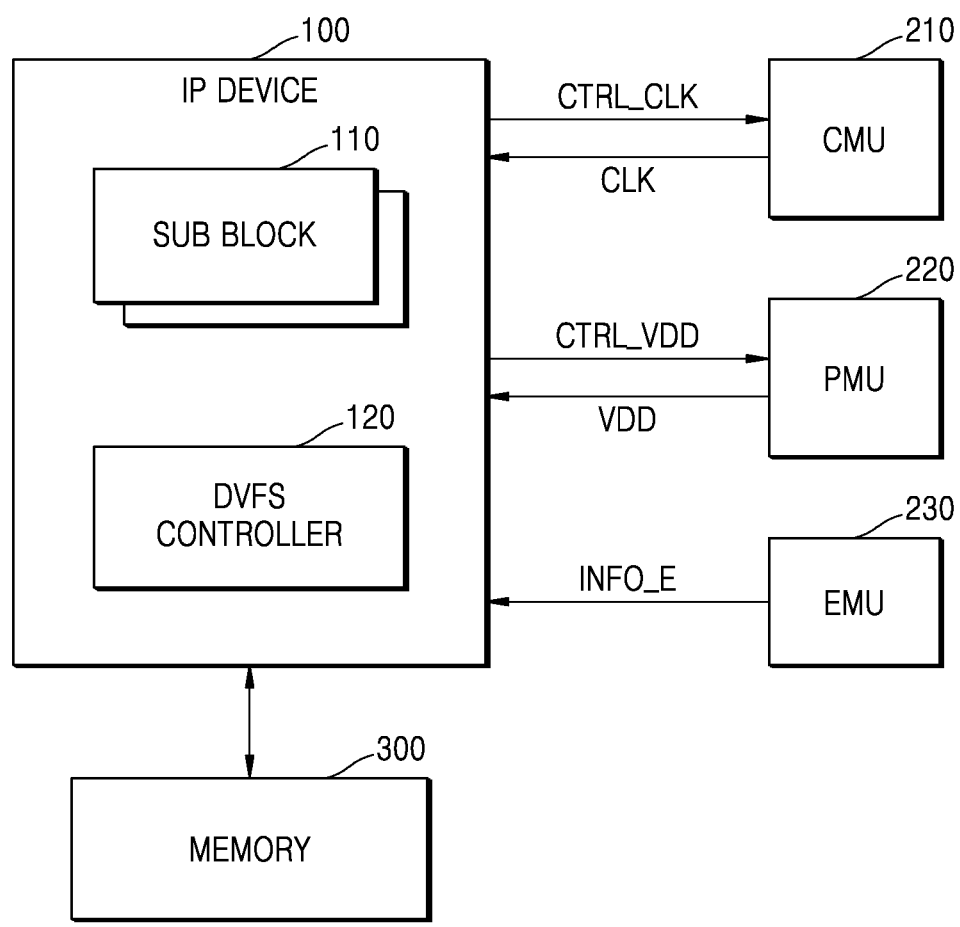
FIG. 1 is a block diagram of a system according to an example embodiment of the present disclosure.

FIG. 1 is a block diagram of a system 10 according to an example embodiment of the present disclosure. The system 10 may include an Internet Protocol (IP) device 100, a clock management unit (CMU) 210, a power management unit (PMU) 220, an environmental management unit (EMU) 230, and a memory 300.

The system 10 may correspond to a data processing device of various types, and may correspond to a mobile device, for example. Additionally, or alternatively, the system 10 may correspond to a laptop computer, a mobile phone, a smartphone, a tablet personal computer (PC), a personal digital assistant (PDA), an enterprise digital assistant (EDA), a digital still camera, a digital video camera, a portable multimedia player (PMP), a personal navigation device, or a portable navigation device, a handheld game console, a mobile Internet device (MID), a wearable computer, an Internet of Things (IoT) device, an Internet of Everything (IoE) device, or an e-book.

The system 10 may include a memory device of various types. For example, the memory 300 may correspond to a semiconductor memory device of various types and may include dynamic random access memory (DRAM), such as double data rate (DDR) SDRAM, low power double data rate (LPDDR) SDRAM, graphics double data rate (GDDR) SDRAM, rambus dynamic random access memory (RDRAM), or the like, according to an embodiment. Further, the memory 300 may further include any of flash memory, phase-change RAM (PRAM), magnetoresistive RAM (MRAM), resistive RAM (ReRAM), and ferroelectric RAM (FeRAM).

In some embodiments, the system 10 may be implemented as a system on a chip (SoC). The SoC may include a system bus to which a protocol with a standard bus specification is applied, and may include various IP devices connected to the system bus. A standard specification of the system bus may include the Advanced Microcontroller Bus Architecture (AMBA) protocol from Advanced RISC Machine (ARM). A type of bus of the AMBA protocol may include Advanced High-Performance Bus (AHB), Advanced Peripheral Bus (APB), Advanced eXtensible Interface (AXI), AXI4, AXI Coherency Extensions (ACE), or the like. Additionally, or alternatively, a protocol of other types, such as uNetwork by SONICs, IBM CoreConnect, Open Core Protocol by OCP-IP, or the like, may be applied.

The IP device 100 may be a mobile phone, or the like and may include a plurality of sub blocks 110 and a dynamic voltage and frequency scaling (DVFS) controller 120. The sub blocks may be configured to process instructions.

The IP device 100 may be designed as an integrated circuit implemented by a plurality of transistors. For example, the IP device 100 may include a central processing unit (CPU), a graphics processing unit (GPU), a neural processing unit (NPU), or an image signal processor (ISP). In FIG. 1, only one IP device, for example, the IP device 100, is shown, but the type of the IP device included in the system 10 and the number of IP devices in the system 10 is not limited thereto. In some embodiments, the DVFS controller 120 may be outside the IP device 100.

The plurality of sub blocks 110 may process instructions independent of each other. Each of the sub blocks may include a CPU core, a GPU core, an NPU core, or an ISP core. Because the IP device 100 includes a plurality of cores, the system 10 may be referred to as a multi-core processor. The sub blocks may also be referred to as sub function blocks.

Each of the plurality of sub blocks 110 may process the instructions according to a clock signal CLK and a power voltage VDD. The performance of each of the sub blocks may depend on the clock signal CLK and the power voltage VDD. As the magnitude of the power voltage VDD increases and the frequency of the clock signal CLK increases, the performance of the IP device 100 may improve while power consumption of the IP device 100 may increase. For convenience of description, in the present specification, the frequency of the clock signal CLK may be referred to as an operating frequency, and the magnitude of the power voltage VDD may be referred to as an operating voltage.

The DVFS controller 120 may determine operating states of various functional blocks in the system 10, and transmit, to the CMU 210 and/or the PMU 220, a clock control signal CTRL_CLK and a power voltage control signal CTRL_VDD for controlling an operating frequency and/or an operating voltage of each of the functional blocks, based on the determination result. For example, the DVFS controller 120 may control the operating frequency and the operating voltage provided to the plurality of sub blocks 110.

For example, the DVFS controller 120 may transmit the clock control signal CTRL_CLK and the power voltage control signal CTRL_VDD for controlling an operating condition of the IP device 100 for each predetermined sample period. For example, the DVFS controller 120 may transmit the clock control signal CTRL_CLK for controlling the frequency of the clock signal CLK, and transmit the power voltage control signal CTRL_VDD for controlling a level of the power voltage VDD.

In the present embodiment, the DVFS controller 120 may calculate a workload of an operation performed by the system 10 and/or the IP device 100, and may refer to a DVFS table stored in the memory 300 to perform a DVFS operation in response to the obtained workload. The DVFS controller 120 may obtain, from the DVFS table, a target voltage and/or a target frequency for maximizing the performance of the IP device 100 in the corresponding workload. In an embodiment, the DVFS controller 120 may obtain a target frequency corresponding to the workload and obtain a target voltage corresponding to the target frequency.

The DVFS controller 120 may determine a workload of the sub blocks 110, identify a first frequency f1 based on the workload, determine a first voltage V1 corresponding to the first frequency f1, transmit the power voltage control signal CTRL_VDD to the PMU 220 to set the power voltage VDD to the first voltage V1, identify a second frequency f2 based on the first voltage V1, and transmit the clock control signal CTRL_CLK to the CMU 210 to set the clock control signal CTRL_CLK to the second frequency f2. DVFS controller 120 is an example of, or includes aspects of, the corresponding element described with reference to FIGS. 1, 2, and 3.

Meanwhile, one or more target frequencies may correspond to one target voltage value. When the IP device 100 has a fixed operating voltage value, the performance or power efficiency of the IP device 100 improves as the operating frequency increases. Therefore, when an operating voltage of the IP device 100 is determined as a first voltage value, determining a greatest frequency among one or more frequencies corresponding to the first voltage value as the operating frequency may improve the performance of the IP device 100.

Therefore, in the present embodiment, the DVFS controller 120 may calculate a target voltage corresponding to a workload through a DVFS operation and set a greatest frequency among one or more frequencies corresponding to the target voltage as a target frequency. Therefore, the performance of the IP device 100 may improve while the power efficiency is maximized.

Additionally, or alternatively, an environmental factor of the IP device 100, for example, temperature, humidity, or the like of the IP device 100, may vary according to a runtime. The environmental factor may affect the operations of the IP device 100 and the DVFS operation. For example, in the same workload, a target voltage and/or a target frequency determined through the DVFS operation may vary according to a temperature or aging degree of the IP device 100. Therefore, in the present embodiment, the DVFS controller 120 may perform a DVFS operation considering environmental factors. This will be described in detail below with reference to FIGS. 5 to 9. Hereinafter, values of each of the environmental factors may be referred to as environmental information.

In the present embodiment, the DVFS controller 120 may refer to hardware capable of performing a DVFS function and a DVFS operation or may refer to computer program code capable of performing a DVFS function and a DVFS operation. However, the DVFS controller 120 is not limited thereto and may refer to an electronic recording medium, for example, a processor, with computer program code capable of performing a DVFS function and a DVFS operation. In other words, the DVFS controller 120 may refer to a functional and/or structural combination of hardware for carrying out the present disclosure and/or software for driving the hardware.

The CMU 210 may generate the clock signal CLK, and may control the frequency of the clock signal CLK based on the clock control signal CTRL_CLK. For example, the CMU 210 may include an oscillator for generating the clock signal CLK based on the clock control signal CTRL_CLK. The CMU 210 may also be referred to as a clock generator or a clock generation circuit.

Additionally, or alternatively, the CMU 210 may receive the clock control signal CTRL_CLK and generate the clock signal CLK at the indicated frequency based on the clock control signal CTRL_CLK. The clock control signal CTRL_CLK may indicate a frequency.

The PMU 220 may generate the power voltage VDD, and may control a magnitude of the power voltage VDD based on the power voltage control signal CTRL_VDD. In an embodiment, the PMU 220 may include a switching regulator for generating the power voltage VDD based on the power voltage control signal CTRL_VDD, and may include a power management integrated circuit (PMIC).

Additionally, or alternatively, the PMU 220 may receive the power voltage control signal CTRL_VDD and generate the power voltage VDD based on the power voltage control signal CTRL_VDD. The power voltage control signal CTRL_VDD may indicate a magnitude of a power voltage VDD.

The EMU 230 may collect environmental information INFO_E in the system 10, and provide the environmental information INFO_E to the IP device 100. In an embodiment, the EMU 230 may include a plurality of thermal sensors, and generate temperature information using temperatures sensed by each of the thermal sensors.

In an embodiment, the EMU 230 may check the aging of system 10 and generate aging information of the system 10. The EMU 230 may measure a degree of degradation of a plurality of semiconductor devices included in the system 10 and generate aging information indicating a high or low degree of aging of the system 10. For example, the aging information may be generated based on a threshold voltage variation, a timing variation, an operating voltage, an operating temperature, or the like of a plurality of semiconductor devices.

The EMU 230 may generate the environmental information INFO_E including information on the performance or characteristics of the semiconductor devices in the system 10. Additionally, or alternatively, the environmental information INFO_E may be generated by reflecting the performance or characteristics of the semiconductor devices that change in real time. In other words, the environmental information INFO_E may include static environmental information and dynamic environmental information, as described in detail with reference to FIG. 5.

The memory 300 may be accessed by the IP device 100, and the IP device 100 may store data in the memory 300 or may read data stored in the memory 300. The memory 300 may include a volatile memory device, such as SRAM, DRAM, or the like, or may include a non-volatile memory device, such as flash memory, resistive random access memory (RRAM), or the like. In some embodiments, the memory 300 may store a DVFS table. In FIG. 1, the memory 300 may be arranged outside the IP device 100. However, the example is not limited thereto, and the memory 300 may be included in the IP device 100.

The system 10 is not limited to the elements shown in FIG. 1, and may further include functional blocks of various types used to communicate with the IP device 100, such as an input/output (IO) interface block, a universal serial bus (USB) host block, a USB slave block, or the like.

Figure 2:
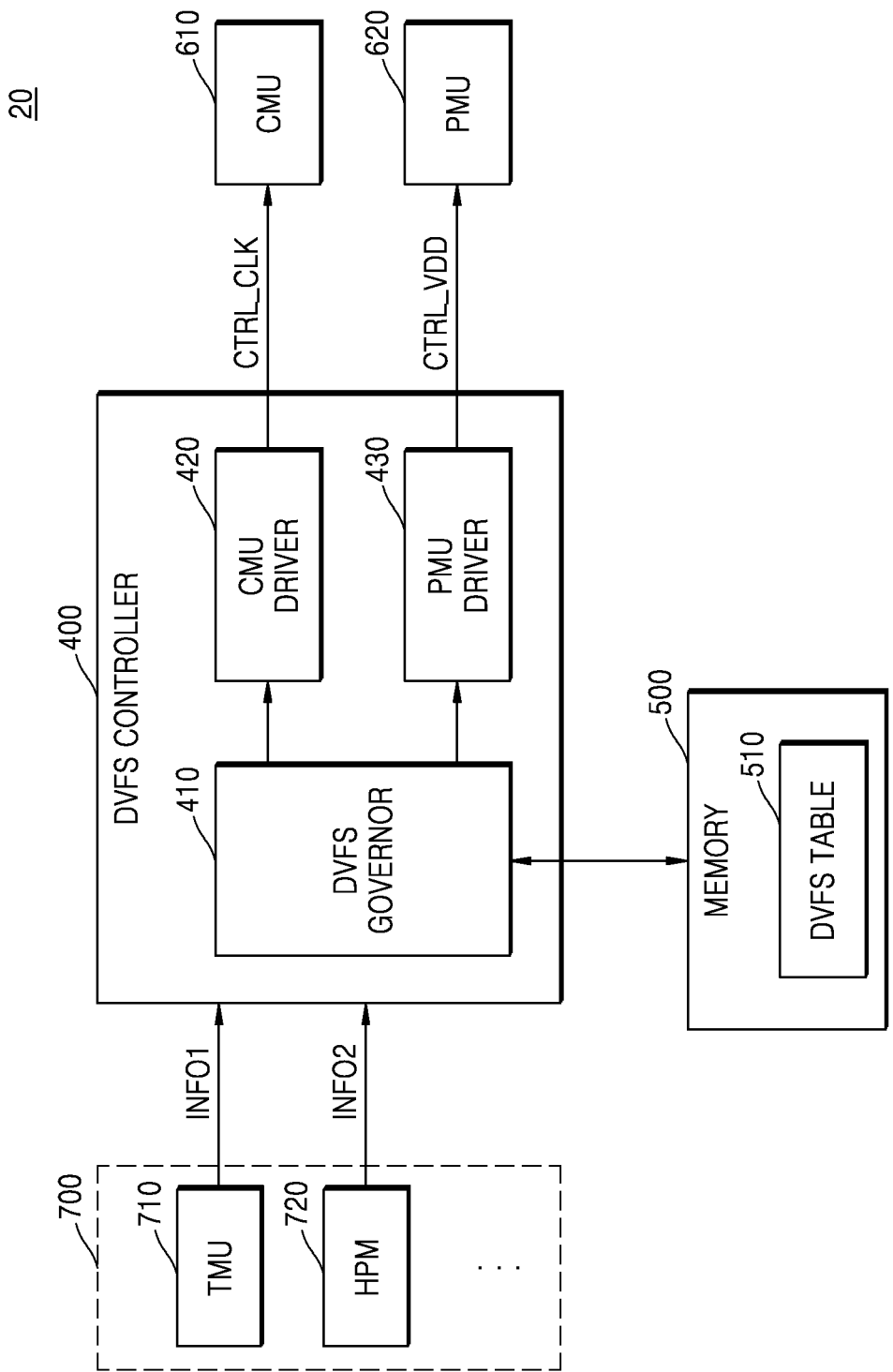
FIG. 2 is a block diagram of a computing system according to an example embodiment of the present disclosure.

FIG. 2 is a block diagram illustrating a computing system 20 according to an example embodiment of the present disclosure.

Referring to FIG. 2, the computing system 20 may include a DVFS controller 400, a memory 500, a CMU 610, a PMU 620, and an EMU 700. The DVFS controller 400, the memory 500, the CMU 610, the PMU 620, and the EMU 700 may correspond to the DVFS controller 120, the memory 300, the CMU 210, the PMU 220, and the EMU 230 of FIG. 1, respectively. Therefore, redundant descriptions thereof will be omitted.

The DVFS controller 400 may include a DVFS governor module 410, a CMU driver 420, and a PMU driver 430. The DVFS governor module 410 may control DVFS operations of the computing system 20. In an embodiment, the DVFS governor module 410 may calculate a workload of the computing system 20 and obtain a DVFS table 510 from the memory 500, to determine a target voltage and/or a target frequency corresponding to the workload. In an embodiment, the DVFS governor module 410 may modify the DVFS table 510 stored in the memory 500 based on information INFO1 and INFO2 collected from the EMU 700, and perform a DVFS operation. In the present embodiment, it is described in an order the DVFS governor module 410 sets a target frequency, sets a target voltage corresponding to the target frequency, and sets a target frequency again, but the order of the DVFS operation is not limited thereto.

The DVFS governor module 410 may control the CMU driver 420 and the PMU driver 430 based on the determined target voltage and/or the determined target frequency. Hereinafter, the term "module" may refer to hardware capable of performing functions and operations according to a name of each module, or may refer to computer program code capable of performing a function and an operation. However, the "module" is not limited thereto and may refer to an electronic recording medium, for example, a processor, with mounted thereon computer program code capable of performing a function and an operation. In other words, the module may refer to a functional and/or structural combination of hardware for performing the present disclosure and/or software for driving the hardware.

The CMU driver 420 may generate the clock control signal CTRL_CLK under the control of the DVFS governor module 410, and provide the clock control signal CTRL_CLK to the CMU 610.

The PMU driver 430 may generate the power voltage control signal CTRL_VDD under the control of the DVFS governor module 410, and provide the power voltage control signal CTRL_VDD to the PMU 620.

The memory 500 may include the DVFS table 510. The DVFS table 510 may include an operating voltage and an operating frequency corresponding to each workload. The DVFS table 510 may include values that may be hard-coded in the memory 500, or may include values that may be modified by soft coding. The DVFS table 510 may be modified by the DVFS governor module 410.

In FIG. 2, the DVFS table 510 is provided singular, but the DVFS table 510 may be provided plural. For example, a plurality of DVFS tables 510 may be generated according to an environmental change of the computing system 20. In an embodiment, the DVFS governor module 410 may select any of a plurality of DVFS tables 510 that may be pre-generated according to a runtime environment, and perform a DVFS operation.

The CMU 610 may generate the clock signal CLK based on the clock control signal CTRL_CLK, and provide the clock signal CLK to elements within the computing system 20.

The PMU 620 may generate the power voltage VDD based on the power voltage control signal CTRL_VDD, and provide the power voltage VDD to the elements within the computing system 20.

The EMU 700 may include a temperature monitor unit (TMU) 710 and a hardware performance monitor unit (HPM) 720, and may further include various modules and/or sensors capable of measuring an environment of the computing system 20. The EMU 700 may generate environmental information INFO_E based on information generated by the TMU 710 and the HPM 720, and provide the environmental information INFO_E to the DVFS controller 400. In other words, the environmental information INFO_E may include temperature information INFO1 and/or performance information INFO2.

The TMU 710 may include a plurality of thermal sensors, and may generate the temperature information INFO1 by using a temperature measured by the plurality of thermal sensors and provide the temperature information INFO1 to the DVFS controller 400. The plurality of thermal sensors may be arranged within the computing system 20, and may also be arranged within the DVFS controller 400. Each of the plurality of thermal sensors may sense an ambient temperature of a designated element.

The HPM 720 may measure the performance of the elements within the computing system 20 in a runtime environment. Additionally, or alternatively, the HPM 720 may measure the performance of the elements irrespective of the runtime environment. The HPM 720 may generate the performance information INFO2 indicating the performance of a plurality of semiconductor devices, such as a speed, an operating voltage, a threshold voltage, or the like of the semiconductor devices. In FIG. 2, the HPM 720 is outside the DVFS controller 400, but the location at which the HPM 720 is arranged is not limited to any location.

Meanwhile, an operation in which the DVFS governor module 410 calculates a workload, collects information from the EMU 700, and modifies the DVFS table 510 may be performed according to preset periods.

Figure 3:
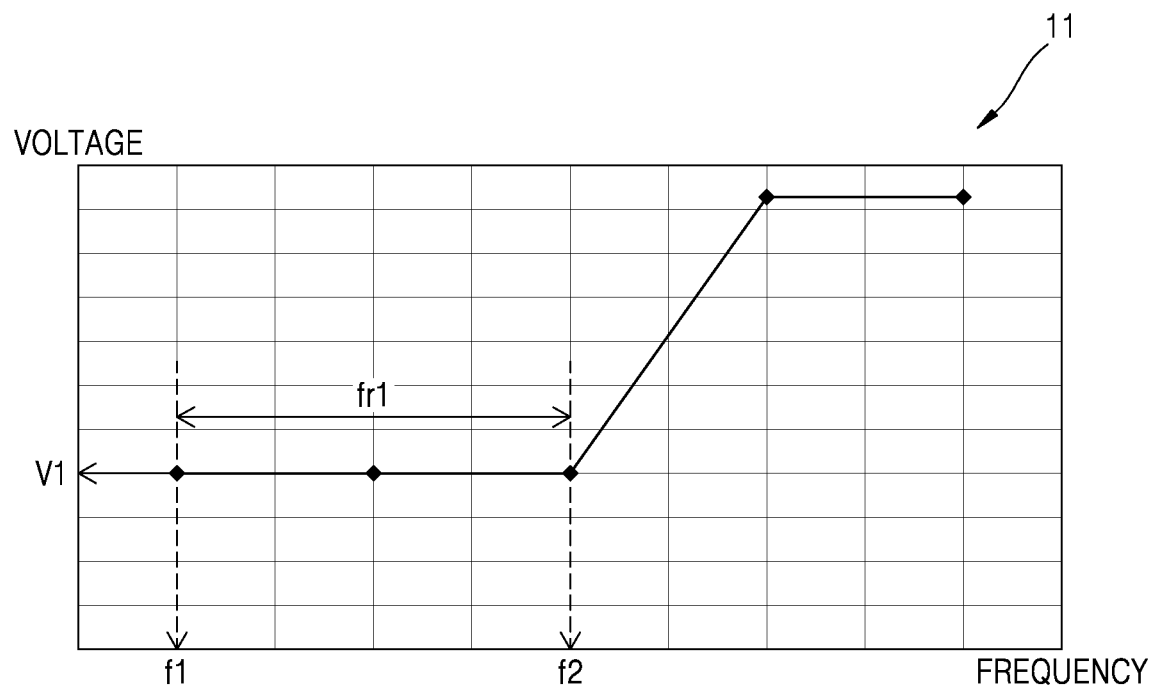
FIG. 3 is a graph showing a relationship between an operating frequency and an operating voltage according to an example embodiment of the present disclosure.

FIG. 3 is a graph 11 showing a relationship between an operating frequency and an operating voltage according to an example embodiment of the present disclosure.

Referring to FIG. 3, the graph 11 may graph a DVFS table (for example, 510 of FIG. 2). As a DVFS operation is performed in the system 10 of FIG. 1 or the computing system 20 of FIG. 2, an operating frequency of the system 10 or the computing system 20 and an operating voltage corresponding thereto may be determined.

An operating frequency for exhibiting optimum performance in a workload may be determined. An operating voltage may be determined in correspondence with the determined operating frequency. In this case, when the CMUs 210 and 610 are capable of setting an operating frequency at smaller intervals than intervals at which the PMUs 220 and 620 set an operating frequency, a single operating voltage may correspond to a plurality of operating frequencies. In an embodiment, a single first voltage V1 may correspond to a plurality of frequencies corresponding to a first frequency range fr1.

In this case, at the same voltage, the performance and power efficiency improve as the clock frequency increases. Therefore, a second frequency f2 may be the highest frequency among frequencies corresponding to the first voltage V1 and may be determined as the operating frequency. For example, the first voltage is set as the target voltage when the first frequency f1 is set as the target frequency and also when the second frequency f2 is set as the target frequency. Therefore, when the first voltage V1 is determined as the target voltage, the performance compared to voltage may be improved by setting the second frequency f2 as the target frequency, instead of the first frequency.

Meanwhile, when the first voltage V1 is set as the target voltage according to a workload, a plurality of frequencies corresponding to the first voltage V1 may vary according to environmental factors of the system 10 or the computing system 20. In an embodiment, the second frequency f2 may be the highest among the frequencies corresponding to the first voltage V1 and may increase as the temperature of the system 10 increases. For example, the second frequency f2 may decrease as the degree of aging of the system 10. Therefore, the use time of the system 10 increases.

Figure 4:
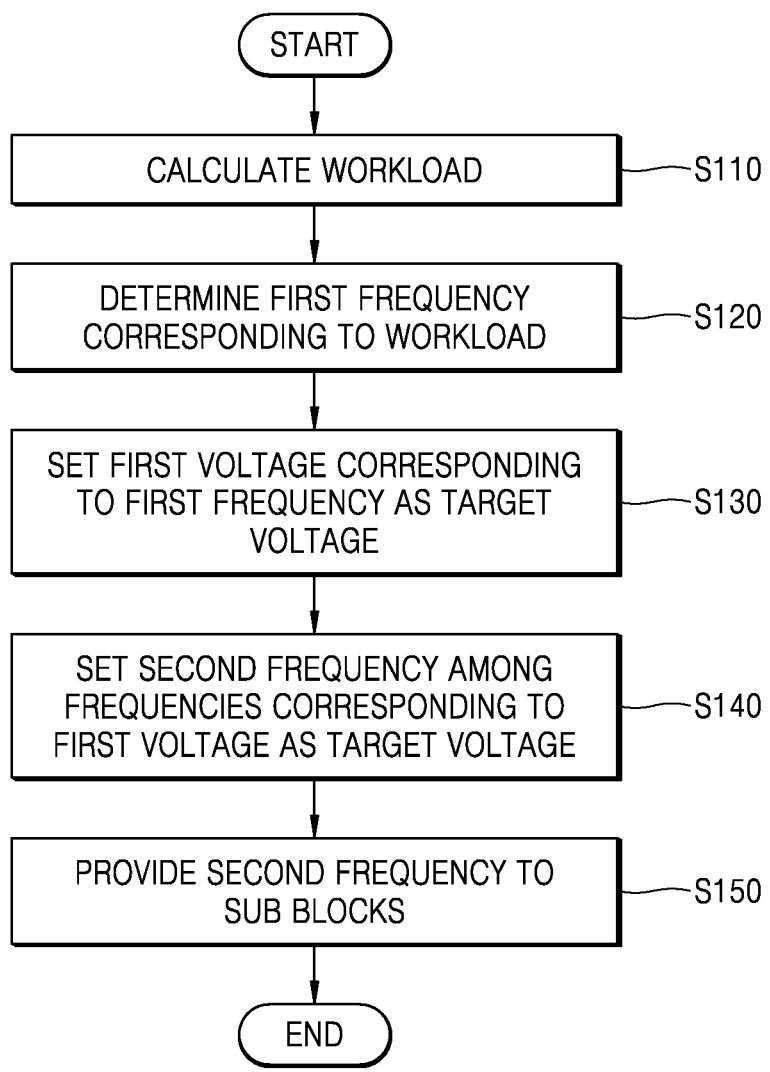
FIG. 4 is a flowchart of a method of operating an Internet Protocol (IP) device according to an example embodiment of the present disclosure.

FIG. 4 is a flowchart of a method of operating an Internet Protocol (IP) device according to an example embodiment of the present disclosure. Referring to FIGS. 2 and 4 together, an operation of calculating a workload may be performed in operation S110. In an embodiment, a workload of the computing system 20 may be obtained. In an embodiment, the DVFS governor module 410 may calculate a workload of the elements within the system 10 or the computing system 20.

An operation of determining a first frequency corresponding to the obtained workload may be performed in operation S120. In an embodiment, the DVFS governor module 410 may determine the first frequency corresponding to the workload with reference to the DVFS table 510 stored in the memory 500.

An operation of setting a first voltage corresponding to the first frequency as a target voltage may be performed in operation S130. In an embodiment, the DVFS governor module 410 may refer to the DVFS table 510 and set the first voltage corresponding to the first frequency as a target voltage of the elements in the computing system 20. For example, the DVFS governor module 410 may control the PMU driver 430 to generate the power voltage control signal CTRL_VDD based on the first voltage and provide the power voltage control signal CTRL_VDD to the PMU 620.

An operation of setting, as a target frequency, a second frequency among frequencies corresponding to the first voltage may be performed in operation S140. In an embodiment, by referring to the DVFS table 510, the DVFS governor module 410 may set the second frequency. The second frequency is the largest value among the plurality of frequencies corresponding to the first voltage, as the target frequency of the elements within the computing system 20.

An operation of providing the second frequency to a plurality of sub blocks (110 of FIG. 1) may be performed in operation S150. In an embodiment, the DVFS governor module 410 may control the CMU driver 420 to generate the clock control signal CTRL_CLK based on the second frequency and provide the clock control signal CTRL_CLK to the CMU 610.

Figure 5:
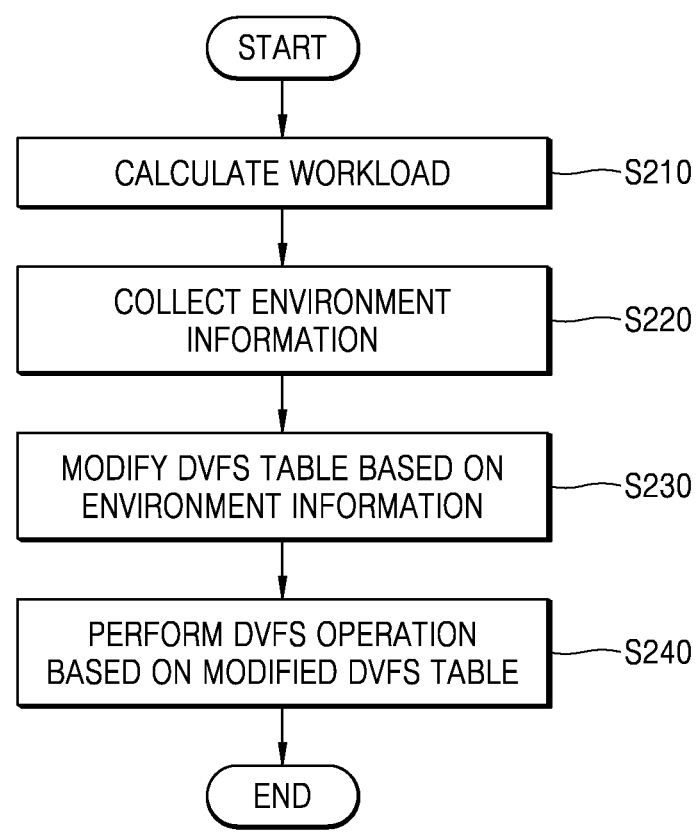
FIG. 5 is a flowchart of a method of operating an Internet Protocol (IP) device according to an example embodiment of the present disclosure.

FIG. 5 is a flowchart of a method of operating an IP device according to an example embodiment of the present disclosure.

Referring to FIGS. 2 and 5 together, an operation of calculating a workload may be performed in operation S210. In an embodiment, the DVFS governor module 410 may calculate a workload of a plurality of sub blocks (for example, 110 of FIG. 1) or the elements within the computing system 20.

An operation of collecting environmental information may be performed in operation S220. In an embodiment, the DVFS governor module 410 may collect environmental information INFO_E of the computing system 20 from the EMU 700. The environmental information INFO_E may include dynamic environmental information and static environmental information. For example, the dynamic environmental information may include at least one of a use rate of the plurality of sub blocks 110, a data size to be processed, a data location, and an operating frequency. The static environmental information may include at least one of the number of sub blocks 110, an operating capability, a size of the memory 500, and a bandwidth of the memory 500.

The operation of collecting the environmental information INFO_E may be performed according to preset periods, and may be performed when a DVFS operation is performed.

An operation of modifying the DVFS table 510 based on the environmental information INFO_E may be performed in operation S230. In an embodiment, the DVFS governor module 410 may modify the DVFS table 510 stored in the memory 500 based on the collected environmental information INFO_E. The operation of modifying the DVFS table 510 may be performed when the environmental information INFO_E is collected, may be performed according to preset periods, or may be performed when the DVFS operation is performed.

In an embodiment, the memory 500 may include a plurality of different DVFS tables according to an environmental factor included in the environmental information INFO_E. The DVFS governor module 410 may select a DVFS table 510 corresponding to the collected environmental information INFO_E from among the plurality of DVFS tables 510.

In an embodiment, the memory may include an operating voltage and an operating frequency for each workload at which a DVFS operation may be performed according to an environmental factor. Therefore, the DVFS governor module 410 may modify the DVFS table 510 stored in the memory 500 based on the operating voltage and the operating frequency corresponding to the collected environmental information INFO_E. For example, the DVFS table 510 may be modified according to a temperature, as described in detail with reference to FIGS. 8 and 9.

A DVFS operation may be performed based on the modified DVFS table, in operation S240. In an embodiment, the DVFS governor module 410 may calculate a workload, and set an operating frequency and an operating voltage corresponding to the obtained workload as a target frequency and target voltage of the computing system 20 based on the modified DVFS table or a selected DVFS table from among a plurality of DVFS tables.

Figure 6:
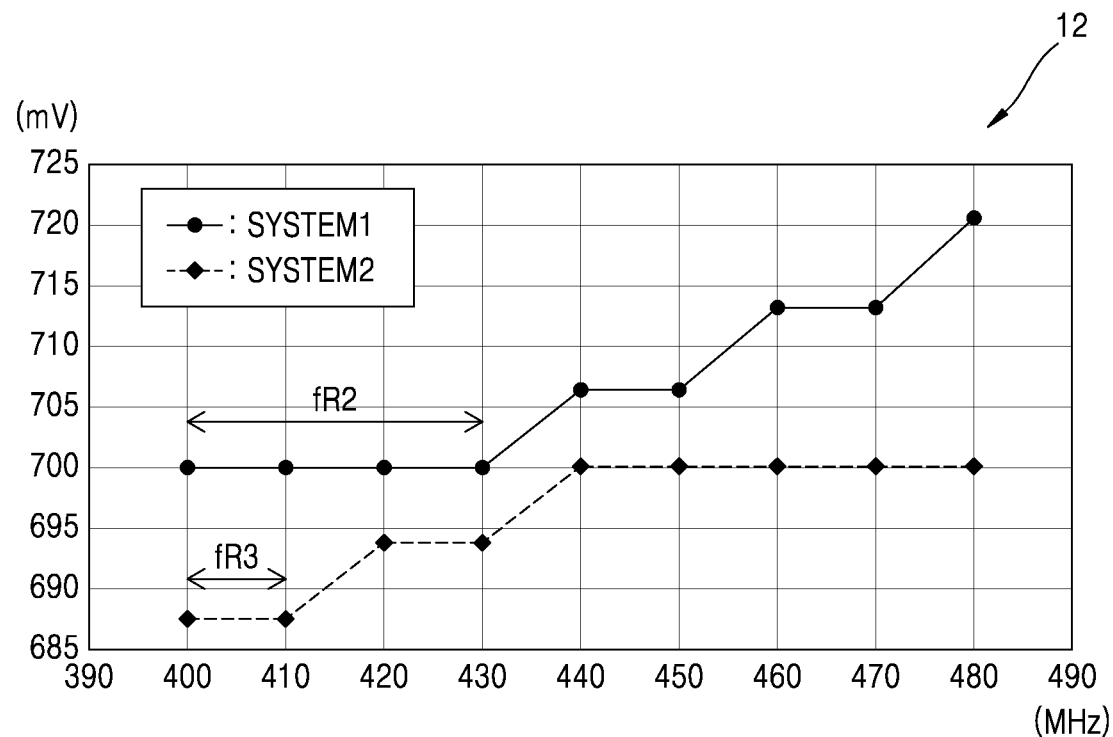
FIG. 6 is a graph showing a relationship between an operating frequency and an operating voltage with respect to different systems according to an example embodiment of the present disclosure.

FIG. 6 is a graph 12 showing a relationship between an operating frequency and an operating voltage with respect to different systems according to example embodiments of the present disclosure, and FIG. 7 is a table 13 showing a relationship between a target frequency and a target voltage with respect to different systems according to example embodiments of the present disclosure.

Referring to FIGS. 6 and 7 together, the DVFS table 510 is changed according to a computing system (for example, 20 of FIG. 2). Therefore, a target voltage and a target frequency may be changed.

For example, a case where workloads of a first system SYSTEM1 and a second system SYSTEM2 are calculated and as a result, target frequencies of the first system SYSTEM1 and the second system SYSTEM2 are determined as 400 MHz will be described with reference to graph 12 and table 13.

In the first system SYSTEM1, an operating voltage corresponding to the target voltage, 400 MHz, may be 700 mV, and frequencies corresponding to 700 mV may be frequencies within a second frequency range fr2. Therefore, according to the present embodiment, the DVFS controller 400 of the first system SYSTEM1 may set any of the frequencies between 400 MHz to 430 MHz, for example, 430 MHz, as the target frequency.

Meanwhile, in the second system SYSTEM2, an operating voltage corresponding to the target frequency, 400 MHz, may be 687.5 mV, and frequencies corresponding to 687.5 mV may be frequencies within a third frequency range fr3. Therefore, according to the present embodiment, the DVFS controller 400 of the second system SYSTEM2 may set any of the frequencies between 400 MHz to 410 MHz, for example, 410 MHz, as the target frequency.

Meanwhile, a DVFS table varies according to an environmental factor even in a single system, for example, the first system SYSTEM1, and accordingly, the target voltage and the target frequency may be changed. This will be described with reference to FIGS. 8 and 9.

Figure 8:
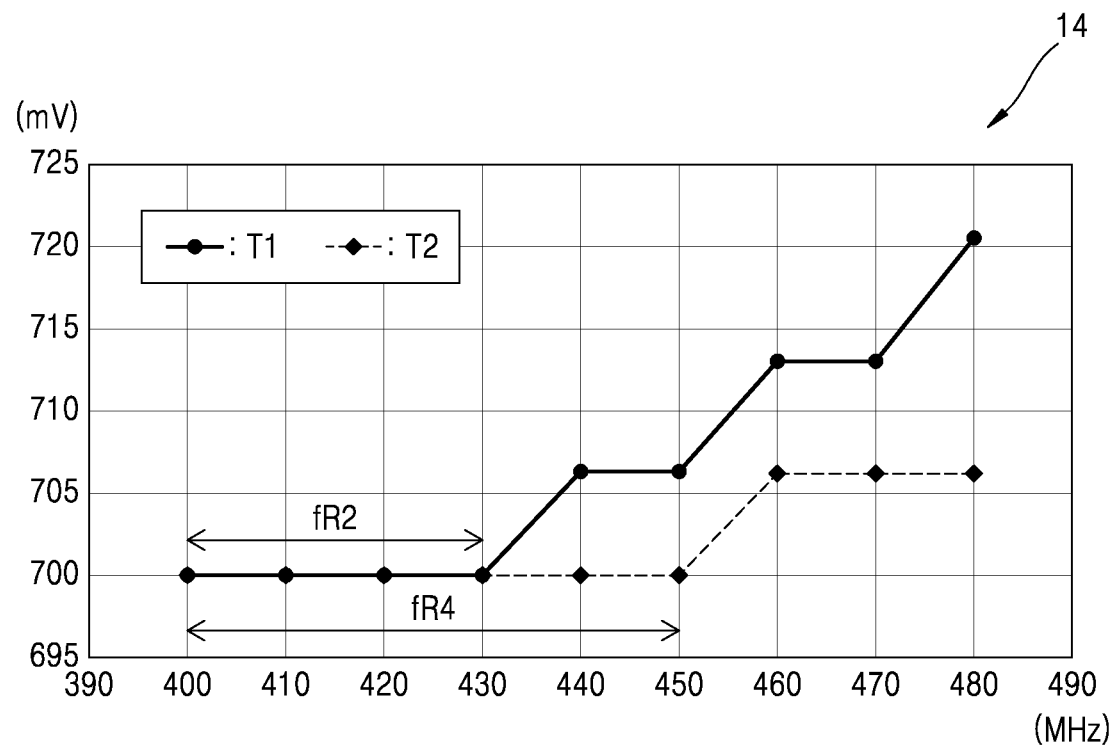
FIG. 8 is a graph showing a relationship between an operating frequency and an operating voltage with respect to two different temperatures according to an example embodiment of the present disclosure.

FIG. 8 is a graph 14 showing a relationship between an operating frequency and an operating voltage with respect to different temperatures according to an example embodiment of the present disclosure, and FIG. 9 is a table 15 showing a relationship between an operating frequency and an operating voltage with respect to different temperatures according to an example embodiment of the present disclosure.

Referring to FIGS. 2 and 8 together, a temperature of a first system 10 may vary according to a runtime environment. As a result, a DVFS operation may be performed using different DVFS tables according to a temperature of a runtime environment in which a workload is obtained.

For example, according to a temperature, a DVFS table itself may be used during a DVFS operation and may be modified. Additionally, or alternatively, information included in the DVFS table may be modified. In an embodiment, at a first temperature T1, the DVFS table may be modified based on information on columns corresponding to the first temperature T1 of table 15, and at a second temperature T2, the DVFS table may be modified based on information on columns corresponding to the second temperature T2 of table 15.

In an embodiment, the memory 300 may include a DVFS table corresponding to the first temperature T1, and a DVFS table corresponding to the second temperature T2. In this case, the DVFS controller 400 may select any of the DVFS table corresponding to the first temperature T1 and the DVFS table corresponding to the second temperature T2 according to a temperature of a runtime environment, and perform a DVFS operation based on the selected DVFS table.

For example, a case where a workload of the first system 10 is obtained and a target frequency corresponding to the workload is determined as 400 MHz is described with reference to the graph 14 and the table 15.

When a temperature of the first system 10 at the time when the workload is obtained is the first temperature T1, an operating voltage corresponding to the target frequency, 400 MHz, may be 700 mV, and frequencies corresponding to 700 mV may be frequencies within the second frequency range fr2. Therefore, according to the present embodiment, the DVFS controller 400 of the first system 10 may set any of frequencies between 400 MHz to 430 MHz, for example, 430 MHz, as the target frequency.

Meanwhile, when the temperature of the first system 10 at the time when the workload is obtained is the second temperature T2, an operating voltage corresponding to the target frequency, 400 MHz, may be 700 mV, and frequencies corresponding to 700 mV may be frequencies within a fourth frequency range fr4. Therefore, according to the present embodiment, the DVFS controller 400 of the first system 10 may set any of frequencies between 400 MHz to 450 MHz, for example, 450 MHz, as the target frequency. Additionally, or alternatively, before the above-described operation is performed, a plurality of DVFS tables according to temperatures may be stored in the memory 500.

Figure 10:
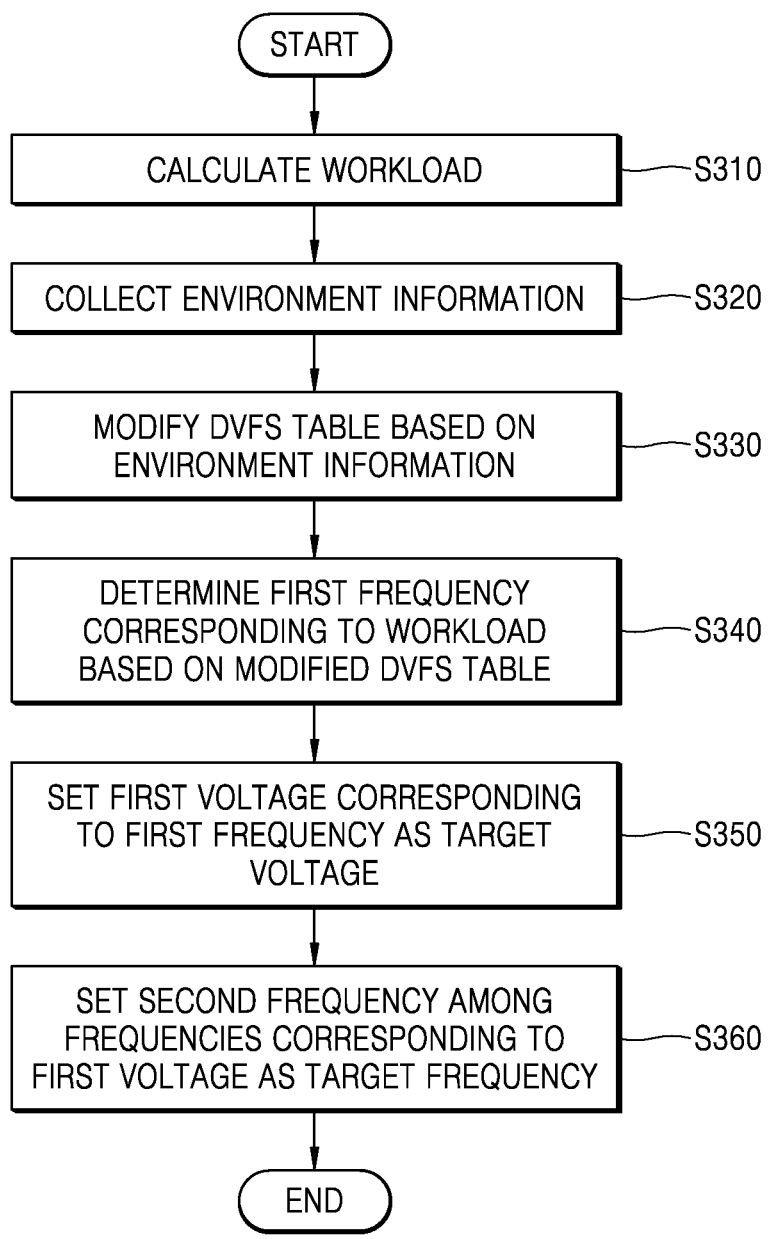
FIG. 10 is a flowchart of a method of operating an IP device according to an example embodiment of the present disclosure.

FIG. 10 is a flowchart of a method of operating an IP device according to an example embodiment of the present disclosure. Referring to FIGS. 2 and 10 together, an operation of calculating a workload may be performed in operation S310. An operation of collecting environmental information INFO_E may be performed in operation S320. An operation of modifying a DVFS table 510 based on the environmental information INFO_E may be performed in operation S330. In an embodiment, an operation of selecting a single appropriate DVFS table 510 among the plurality of DVFS tables stored in the memory 500 based on the environmental information INFO_E may be performed instead of operation S330.

An operation of determining a first frequency corresponding to the obtained workload based on the modified DVFS table 510 may be performed in operation S340. In an embodiment, the DVFS governor module 410 may refer to the modified DVFS table 510 stored in the memory 500 and determine the first frequency corresponding to the workload. An operation of determining a first frequency corresponding to the obtained workload based on a selected DVFS table from among the plurality of DVFS tables according to the environmental information INFO_E may be performed.

An operation of setting a first voltage corresponding to the first frequency as the target voltage may be performed in operation S350. An operation of setting a second frequency among the frequencies corresponding to the first voltage as the target frequency may be performed in operation S360. Thereafter, an operation of providing the second frequency to a plurality of sub blocks (for example, 110 of FIG. 1) may be further performed.

Figure 11:
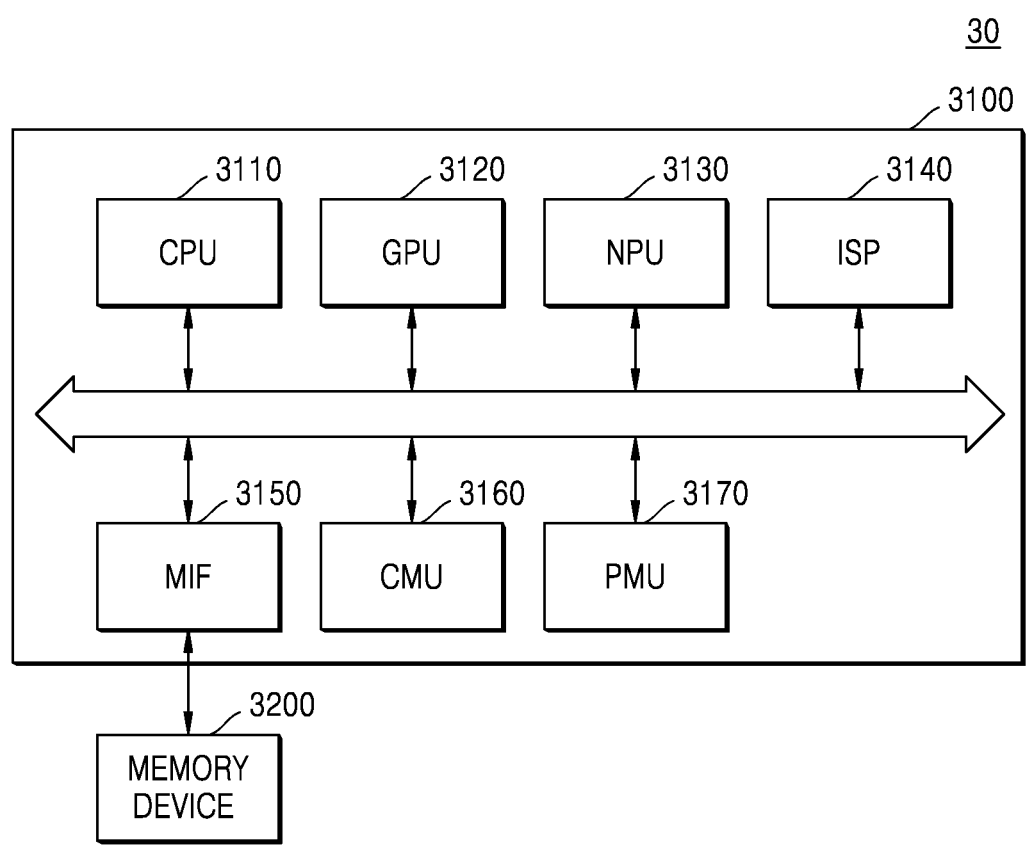
FIG. 11 is a block diagram of a system according to an example embodiment of the present disclosure.

FIG. 11 is a block diagram illustrating a system 30 according to an example embodiment of the present disclosure. The system 30 may be implemented as a mobile phone, a smartphone, a tablet computer, a personal digital assistant (PDA), an enterprise digital assistant (EDA), a digital still camera, a digital video camera, a portable multimedia player (PMP), a personal navigation device, or a portable navigation device, a handheld game console, or a handheld device such as e-books.

The system 30 may include an SoC 3100 and a memory device 3200. The SoC 3100 may include a CPU 3110, a GPU 3120, an NPU 3130, an ISP 3140, a memory interface (MIF) 3150, a clock management unit (CMU) 3160, and a power management unit (PMU) 3170. The CPU 3110, the GPU 3120, the NPU 3130, and the ISP 3140 may be referred to as primary IP devices, and the MIF 3150 may be referred to as a secondary IP device. At least one of the CPU 3110, the GPU 3120, the NPU 3130, the ISP 3140, and the MIF 3150 may be an implementation of the IP device described above with reference to FIGS. 1 to 10. Therefore, at least one of the CPU 3110, the GPU 3120, the NPU 3130, the ISP 3140, and the MIF 3150 may include a plurality of sub blocks, and may include a DVFS controller for performing a DVFS operation based on a DVFS table stored in the memory device 3200 and collected environmental information. The DVFS controller included in the CPU 3110, the GPU 3120, the NPU 3130, the ISP 3140, and the MIF 3150 may control the CMU 3160 or the PMU 3170, and the CPU 3110, the GPU 3120, the NPU 3130, the ISP 3140, and the MIF 3150 may process one or more instructions by receiving a clock signal CLK from the CMU 3160 and receiving a power voltage from the PMU 3170.

The CPU 3110 may process or execute commands and/or data stored in the memory device 3200 in response to the clock signal CLK generated by the CMU 3160.

The GPU 3120 may obtain image data stored in the memory device 3200 in response to the clock signal CLK generated by the CMU 3160. From image data provided from the MIF 3150, the GPU 3120 may generate data output through a display device (not shown), and may encode the image data.

The NPU 3130 may refer to any device used to execute a machine learning model. The NPU 3130 may be a hardware block that may be designed to execute a machine learning model. The machine learning model may include a model based on an artificial neural network, a decision tree, a support vector machine, regression analysis, a Bayesian network, a genetic algorithm, etc. The artificial neural network may include, as non-limiting examples, a convolution neural network (CNN), a region with convolution neural network (R-CNN), a region proposal network (RPN), a recurrent neural network (RNN), a stacking-based a deep neural network (S-DNN), a state-space dynamic neural network (S-SDNN), a deconvolution network, a deep belief network (DBN), a restricted Boltzmann machine (RBM), a fully convolutional network, a long short-term memory (LSTM) network, and a classification network.

The ISP 3140 may perform a signal processing operation on raw data received from an image sensor (not shown) outside the SoC 3100 and generate digital data with improved image quality.

The MIF 3150 may provide an interface for the memory device 3200 outside the SoC 3100. The memory device 3200 may include dynamic random access memory (DRAM), phase-change random access memory (PRAM), resistive random access memory (ReRAM), or flash memory. The memory device 3200 may include a plurality of DVFS tables according to environmental factors. Each of the DVFS tables may be modified by a DVFS controller.

The CMU 3160 may generate a clock signal, and provide the clock signal to the elements of the SoC 3100. The CMU 3160 may include a clock generation device, such as a phase-locked loop (PLL), delayed locked loop (DLL), crystal, or the like. The PMU 3170 may convert external power to internal power, and supply the internal power to the elements of the SoC 3100.

Figure 12:
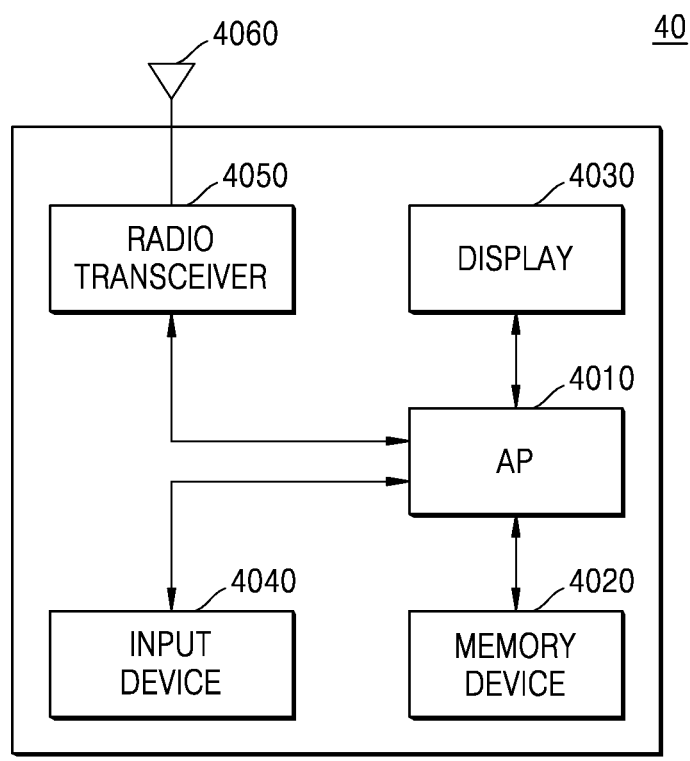
FIG. 12 is a block diagram of a communication device including an application processor according to an example embodiment of the present disclosure.

FIG. 12 is a block diagram illustrating a communication device 40 including an application processor 4010 according to an example embodiments of the present disclosure.

Referring to FIG. 12, the communication device 40 may include the application processor 4010, a memory device 4020, a display 4030, an input device 4040, and a radio transceiver 4050. The application processor 4010 may be an implementation of at least one of the IP devices described above with reference to FIGS. 1 to 11.

The radio transceiver 4050 may transmit or receive radio signals through an antenna 4060. For example, the radio transceiver 4050 may change a radio signal received via the antenna 4060 into a signal that may be processed by the application processor 4010.

Therefore, the application processor 4010 may process the signal output from the radio transceiver 4050 and transmit the processed signal to the display 4030. Additionally, or alternatively, the radio transceiver 4050 may change the signal output from the application processor 4010 into a radio signal and transmit the radio signal to an external device via the antenna 4060.

The input device 4040 is a device via which a control signal for operations of the application processor 4010 or data to be processed by the application processor 4010 may be input, and may be implemented as a pointing device such as a touch pad and a computer mouse, a keypad, or a keyboard.

According to an embodiment, the application processor 4010 may include a plurality of sub blocks and a DVFS controller for controlling the plurality of sub blocks. As described above with reference to FIGS. 1 to 11, the DVFS controller may perform a DVFS operation based on environmental information of elements within a communication device.

Although not shown in FIG. 12, the communication device 40 may further include a CMU for providing a clock signal to various elements provided in the communication device 40, and a PMU for providing a power voltage to the various elements provided in the communication device 40. The CMU may output a clock signal with an adjusted frequency under the control of the DVFS controller, and the PMU may output a power voltage with an adjusted magnitude under the control of the DVFS controller.

While the present disclosure has been particularly shown and described with reference to embodiments thereof, it will be understood that various changes in form and details may be made therein without departing from the spirit and scope of the following claims.

What is claimed is:

1. An integrated circuit comprising:
   one or more sub blocks; and
   a dynamic voltage and frequency scaling (DVFS) controller configured to calculate a workload of the one or more sub blocks, to determine a first frequency as a target frequency for the one or more sub blocks based on a DVFS table indicating that the first frequency corresponds to the workload of the one or more sub blocks, to determine a first voltage corresponding to the first frequency determined from the DVFS table, to select a second frequency as the target frequency for the one or more sub blocks from among a plurality of frequencies corresponding to the first voltage of the first frequency from the DVFS table, wherein the second frequency is greater than the first frequency from the DVFS table, and to provide the second frequency as an operating frequency to the one or more sub blocks.

2. The integrated circuit of claim 1, wherein the integrated circuit is connected to a memory,
the DVFS table is stored in the memory, and
the DVFS table includes frequency information corresponding to the workload and voltage information corresponding to the frequency information.

3. The integrated circuit of claim 2, wherein the DVFS controller is further configured to collect environmental information of the integrated circuit from an environmental monitoring unit, and modify the DVFS table based on the environmental information.

4. The integrated circuit of claim 3, wherein the environmental information includes at least one of temperature information of the integrated circuit and aging information of the integrated circuit.

5. The integrated circuit of claim 3, wherein the DVFS controller is further configured to determine a third frequency corresponding to the workload based on the modified DVFS table, to calculate a second voltage corresponding to the third frequency, and to provide, to the plurality of sub blocks, a fourth frequency among at least one frequency corresponding to the second voltage.

6. The integrated circuit of claim 1, wherein the second frequency is a greatest frequency among the plurality of frequencies corresponding to the first voltage of the first frequency from the DVFS table.

7. The integrated circuit of claim 4, wherein the second frequency is a frequency of a clock signal applied to the plurality of sub blocks, and
the first voltage is a magnitude of a power voltage applied to the plurality of sub blocks.

8. The integrated circuit of claim 1, wherein each of the sub blocks includes any of a central processing unit (CPU) core, a graphics processing unit (GPU) core, a neural processing unit (NPU) core, and an image signal processor (ISP) core.

9. A method of operating an integrated circuit, the method comprising:
calculating a workload of one or more sub blocks;
calculating a first frequency as a target frequency for the one or more sub blocks based on a DVFS table indicating that the first frequency corresponds to the workload of the one or more sub blocks;
calculating a first voltage based on the first frequency determined from the DVFS table;
selecting a second frequency as the target frequency for the one or more sub blocks from among a plurality of frequencies corresponding to the first voltage of the first frequency from the DVFS table, wherein the second frequency is greater than the first frequency from the DVFS table; and
providing the second frequency as an operating frequency to the one or more sub blocks.

10. The method of claim 9, wherein the determining of the first frequency corresponding to the workload comprises:
collecting, from an environmental monitoring unit, environmental information of the plurality of sub blocks;
modifying a dynamic voltage and frequency scaling (DVFS) table stored in a memory to a first DVFS table based on the environmental information; and
determining the first frequency based on the first DVFS table.

11. The method of claim 9, wherein the providing of the second frequency to the plurality of sub blocks comprises determining a greatest frequency among the plurality of frequencies corresponding to the first voltage of the first frequency from the DVFS table.

12. The method of claim 11, wherein a magnitude of the second frequency increases as a temperature of the integrated circuit increases.

13. The method of claim 11, wherein a magnitude of the second frequency decreases as a degree of aging of the integrated circuit increases.

14. The method of claim 9, wherein the providing of the second frequency to the plurality of sub blocks comprises providing the second frequency as a frequency of a clock signal applied to the plurality of sub blocks.

15. A computing system comprising:
one or more sub blocks;
a memory storing clock signal information according to a workload of the one or more sub blocks, and a dynamic voltage and frequency scaling (DVFS) table indicating power voltage information according to the workload of the one or more sub blocks;
an environmental management unit configured to generate environmental information of the computing system; and
a DVFS controller configured to modify the DVFS table stored in the memory based on the environmental information, to calculate a workload of the one or more sub blocks of the computing system, to determine a first frequency as a target frequency for the one or more sub blocks based on the DVFS table indicating that the first frequency corresponds to the workload of the one or more sub blocks, to determine a first voltage corresponding to the first frequency based on the modified DVFS table, to select a second frequency as the target frequency for the one or more sub blocks from among a plurality of frequencies corresponding to the first voltage of the first frequency based on the modified DVFS table, and to perform a DVFS operation on the plurality of sub blocks based on the second frequency, wherein the second frequency is greater than the first frequency from the modified DVFS table.

16. The computing system of claim 15, wherein the DVFS controller is further configured to provide, to the one or more sub blocks, the second frequency as an operating frequency based on the modified DVFS table.

17. The computing system of claim 16, wherein the DVFS controller is further configured to determine a first frequency corresponding to the workload, to calculate a first voltage corresponding to the first frequency, and to provide, to the plurality of sub blocks, a second frequency, which is a greatest frequency from among the plurality of frequencies corresponding to the first voltage of the first frequency from the modified DVFS table.

18. The computing system of claim 17, wherein the second frequency includes a frequency of a clock signal applied to the plurality of sub blocks.

19. The computing system of claim 15, wherein the environmental information includes static environmental information, and dynamic environmental information determined according to a runtime of the plurality of sub blocks.

20. The computing system of claim 19, wherein the dynamic environmental information comprises at least one of temperature information of the computing system and aging information of the computing system.

* * * * *